US005570062A

United States Patent [19]
Dent

[11] Patent Number: 5,570,062
[45] Date of Patent: Oct. 29, 1996

[54] AM-FM TRANSMITTER POWER AMPLIFIER USING CLASS-BC

[75] Inventor: Paul W. Dent, Stehag, Sweden

[73] Assignee: Ericsson GE Mobile Communications Inc., Research Triangle Park, N.C.

[21] Appl. No.: 321,446

[22] Filed: Oct. 12, 1994

[51] Int. Cl.$^6$ .................................. H03F 3/19; H03F 3/26
[52] U.S. Cl. ........................... 330/51; 330/276; 330/286; 330/295
[58] Field of Search ........................ 330/51, 56, 124 R, 330/202, 276, 286, 295, 296, 297; 455/93

[56] References Cited

U.S. PATENT DOCUMENTS

| | | | |
|---|---|---|---|
| 3,577,092 | 5/1971 | Kubicz | 330/296 X |
| 3,579,136 | 5/1971 | Machamer | 330/296 |
| 3,832,643 | 7/1974 | Van Heyningen et al. | 330/276 X |
| 4,087,761 | 5/1978 | Fukumoto et al. | |
| 4,117,418 | 9/1978 | Höglund | 330/296 |
| 4,158,179 | 6/1979 | Sakai et al. | 330/296 X |
| 4,236,120 | 11/1980 | White | 330/296 |
| 4,262,262 | 4/1981 | Höglund | 330/297 X |
| 4,319,199 | 3/1982 | Sunderland | 330/297 |
| 4,472,688 | 9/1984 | Saburo et al. | 330/297 |
| 4,494,078 | 1/1985 | Vassilev et al. | |
| 4,668,921 | 5/1987 | Tamura | 330/297 |
| 4,959,873 | 9/1990 | Flynn et al. | 330/295 X |
| 4,994,757 | 2/1991 | Bickley et al. | |
| 5,175,871 | 12/1992 | Kunkel | |
| 5,193,219 | 3/1993 | Tamura | |
| 5,239,275 | 8/1993 | Leitch | |
| 5,251,331 | 10/1993 | Schwent et al. | |

FOREIGN PATENT DOCUMENTS

| | | | |
|---|---|---|---|
| 52-353 | 4/1977 | Japan | 330/276 |
| 55358 | 5/1977 | Japan | 330/276 |
| 55357 | 5/1977 | Japan | 330/276 |
| 136117 | 8/1983 | Japan | 330/297 |
| 594576 | 2/1978 | U.S.S.R. | 330/276 |
| 2082412 | 3/1982 | United Kingdom | 330/297 |
| 9318590 | 9/1993 | WIPO | 455/93 |

OTHER PUBLICATIONS

F. H. Raab, "Average Efficiency of Class–G Power Amplifiers," *IEEE Transanctions on Consumer Electronics*, pp. 145–150, vol. CE–32, No. 2, May 1986, New York.

Dent, "High Power Distortionless Amplifiers, " Honours Project 1963–1964, University of Southhampton, pp. 0–38, 7 sheets graphs (no month).

*Primary Examiner*—James B. Mullins
*Attorney, Agent, or Firm*—Burns, Doane, Swecker & Mathis, L.L.P.

[57] ABSTRACT

A power amplifier circuit for efficiently generating an output signal into a load at more than one alternative power level has at least two amplifiers, each having optimum efficiency at different power output levels. The power amplifier circuit may be operated in several modes, including activating one amplifier during an entire cycle of an input signal to be amplified, or alternatively activating one amplifier based on a control signal that is independent of the amplified output signal. In either case, remaining amplifiers are deactivated. Coupling between the amplifiers prevents deactivated amplifiers from impeding the flow of power from the activated amplifier to the load. In another aspect of the invention, optimum efficiency at different power output levels is achieved by means of coupling each amplifier to a common power source and to the load via an impedance matching circuit, the impedance transformation being different for different amplifiers. The impedance matching circuit may comprise a push-pull transformer having taps to provide different turns ratios between respective amplifiers and the load. Alternatively, the matching circuit may comprise a number of quarter-wavelength lines each coupled at one end to the load and at the other end to one of the amplifiers via a balun.

9 Claims, 5 Drawing Sheets

AM-FM TRANSMITTER POWER AMPLIFIER USING CLASS-BC

BACKGROUND

The present invention relates to a radio frequency power amplifier that operates efficiently when used for amplifying signals of varying amplitude, and that may be switched to a more efficient mode of operation for amplifying a signal of constant amplitude. The invention further relates to a radio frequency power amplifier that provides higher efficiency when operation at alternate output levels is needed, with either constant or varying amplitude signals.

Radio transmission of signals and information takes place by impressing the signals on a radio frequency wave known as the "carrier", the process of impressing the information being known as "modulation". The most often used methods of modulation are the two special classes known respectively as Amplitude Modulation (AM) and Frequency Modulation (FM).

In AM, only the amplitude or strength of the radio frequency (RF) carrier is varied by the information-bearing signals, the frequency of the RF carrier being constant. In FM, only frequency of the RF carrier is varied, the amplitude being constant.

Frequency modulation is one of a wider class of constant-amplitude modulations in which the phase angle variation of the carrier carries the information. Constant amplitude modulations are the easiest for which to construct an efficient transmitter, as their design can be optimized to give maximum efficiency at the one and only output power level used.

Amplitude modulation is more difficult to generate efficiently, and usually requires a different design of transmitter.

A more general class of modulations, called "complex modulation", permits both the amplitude and phase angle of the carrier wave to be varied. This class requires use of a "linear" type of transmitter power amplifier in order to accurately reproduce the modulated amplitude of the input waveform, and consequently is the most difficult in which to achieve high efficiency while simultaneously maintaining linear operation and avoidance of intermodulation distortion. The most common modulation falling in this class is SSB (Single SideBand) modulation.

A number of different RF power amplification techniques are known in the art. These will now be described.

1. High Level Modulation

The most efficient way to generate a high-power amplitude-modulated signal is the so-called high-level modulation method, where the low-frequency modulating signal itself is strongly amplified and used as a varying power supply for the high power RF amplifier. In this system, the RF power amplifier can operate at maximum efficiency in the class-C regime as in the case of FM, as the output power variations are produced by varying the input power supply proportional to the instantaneous power level desired.

A high-level modulator must generate up to half the transmitter output carrier power and is therefore a large, heavy and costly element. This makes this type of amplifier unsuitable for use in applications where size, weight or cost considerations are more important than efficiency of power generation. In such cases, low-level modulation schemes are sometimes used, instead. A typical low level modulation scheme generates the amplitude modulated RF carrier first at a low power level where the efficiency of the method is immaterial, and then amplifies it to a high power level using a linear power amplifier, similar to that used for complex modulations such as SSB.

2. Linear Power Amplifiers

The classic forms of linear power amplifiers operate in the regimes known as class-A or class-B.

2.1 Class-A Power Amplifier Efficiency

A class-A amplifier device is biased to continuously consume, even when not required to produce any output power, a mean current equal to half the peak current that it draws when generating maximum output power. When driven with a maximum amplitude AC input signal, such as a sinusoidal radio carrier frequency signal, the class-A amplifier current swings between zero and twice the mean current, but the average over a cycle of the input signal remains constant. The signal power output under these circumstances is a maximum, and the efficiency is a maximum of 50%.

When driven by an AC input signal of less than the maximum amplitude, the class-A current swings between corresponding fractions of the mean current, but the average current is still constant. Taking, for example, the case of an AC input signal of half the maximum amplitude, the class-A current swings between 0.5 and 1.5 times the mean current, but the average current is still equal to the mean current. The signal power under these conditions is only one quarter the maximum power output, but the current consumption from the supply remains the same high value as for maximum power output. The efficiency at lower outputs is thus reduced, being only 12.5% at half amplitude, quarter power output conditions.

An RF signal that is varied in amplitude symmetrically about a mean amplitude by an amplitude modulating signal, the maximum amplitude variation being from zero through the mean to twice the mean (i.e., amplitude varying from mean−mean to mean+mean), must be adjusted so that the peak amplitude of twice the mean corresponds to less or equal to the maximum power condition of the class-A amplifier mentioned above, in order to avoid distortion. It is thus only at that momentary peak amplitude that the class-A power amplifier delivers its maximum efficiency of 50%, and the average efficiency averaged over a modulating cycle is reduced. Under conditions where the modulating signal is quiescent and the amplifier is driven to an RF mean output level equal to half the peak RF output level (the unmodulated carrier condition of an AM transmitter), the efficiency for generating the quiescent carrier is only 12.5%.

2.2 Class-B Power Amplifier Efficiency

The low efficiency of the class-A amplifier in the mean is due to its not reducing its power consumption when the output power requirement is at a low point. This disadvantage is partially overcome by the class-B amplifier.

The classic class-B amplifier consists of two identical amplifier devices arranged in a push-pull configuration and biased just at the point where they are not consuming any current from the supply when no RF input drive signal is present. If the RF input drive signal swings in the positive direction, one of the devices will begin to take current proportionally, while the other takes over on the negative half cycles.

Each device in the class-B amplifier thus takes a half-sine shaped burst of current with a mean value of $1/\pi$ times the peak. The total current taken by both devices from the supply is then $2/\pi$ times the peak current. The total current increases with RF drive level, thereby increasing the signal delivered to the load (the antenna) proportionally until the output voltage swing developed across the load impedance is almost equal to the available power supply voltage. A further increase in RF drive cannot increase the voltage developed across the load beyond this point, and the amplifier is said to have saturated, or to be "clipping". For linear modulation applications, the amplifier must not be driven into this region, or else distortion of the modulation will occur.

The maximum peak current drawn by each of the push-pull devices just before clipping is equal to the power supply voltage $V_o$ divided by the load impedance $R_L$.

$$I_{max} = V_o / R_L$$

The mean current being $2/\pi$ times the peak, we obtain the mean input power from the supply to be:

$$V_o \cdot I_{max} \cdot 2/\pi = (2/\pi) V_o^2 / R_L$$

while the AC power developed in the load $R_L$ is $0.5 V_o^2 / R_L$. Taking the ratio of output AC power to power consumption gives the efficiency $\pi/4$ or 78.5%.

The efficiency at lower than peak amplitude is calculated by observing that the power consumption reduces in proportion to the output voltage swing while the power output reduces in proportion to the square of the output voltage swing. The efficiency thus reduces linearly with output amplitude, so that at a mean amplitude equal to half the peak, the efficiency is equal to half the peak efficiency, that is $0.5\pi/4$ or 39%.

This is a considerable improvement upon the class-A amplifier's 12.5% efficiency at half its peak amplitude level, and occurs because the class-B amplifier reduces its current drawn in proportion to the demand. It is however still a low efficiency compared to the 78.5% of the class-B power amplifier at full output. The theoretical efficiency of the non-linear class-C amplifier is even better, approaching 100%, so there is a large penalty in efficiency for low-level modulated AM transmitters compared to FM transmitters.

3. Load Impedance Switching

Where a transmitter must sometimes work with AM signals and sometimes with FM signals, the reduced efficiency of the AM design usually still pertains in the FM mode. This can be problematic in applications such as portable radiotelephone transmitters that, because of small size requirements and reliance on battery power supplies, require that a single power amplifier operate efficiently in alternative AM and FM modes of operation, and have the same mean power output level in both cases.

If a class-B amplifier is to be used for a 1 watt carrier power AM transmitter, it must be capable of generating 4 watts on modulation peaks at which the amplitude is doubled. If such an amplifier were then used for a 1 watt FM transmitter, its efficiency would only be 39% instead of the 78.5% theoretically possible. In battery operated equipment such as handheld radios, the choices of either running the power amplifier at 1 watt and half efficiency or 4 watts with full efficiency both have a negative impact on battery life.

Several techniques are known which address this problem.

U.S. Pat. No. 5,060,294 to Schwent, which is incorporated herein by reference, describes an amplifier in which the load impedance is switched between a first value which causes the amplifier to saturate and a second value which prevents the amplifier from saturating. This permits the amplifier to be used with either constant or varying amplitude signals. However, Schwent is silent on achieving alternative power output levels at improved efficiencies.

U.S. patent application Ser. No. 08/061,345 to Dent, filed on May 17, 1993, which is also incorporated herein by reference, discloses an amplifier which employs load impedance switching to achieve optimum efficiencies at alternative output power levels, the alternative output power levels corresponding to amplifier operation in either a linear (e.g., class-B) mode in both cases for use with varying-amplitude signals or a saturated (e.g., class-C) mode in both cases for use with constant amplitude signals. The use of impedance switching, however, has a number of drawbacks, including the losses associated with the switches and the abrupt transition from one mode to another. Furthermore, the efficiency of this type of amplifier is low when operating in a linear mode.

It is therefore desirable to provide an RF power amplifier that can operate in a linear (e.g., class-B) mode at one power level and in a saturated (e.g., class-C) mode at an alternative output power level without the use of load impedance switching or the use of alternative power supply voltages.

SUMMARY

It is therefore an object of the invention to provide a power amplifier that can be operated either in a linear mode for amplifying signals having amplitude modulation or at a reduced power level in FM mode yet with the full practically achievable efficiency.

It is another object of the invention to provide a power amplifier that can be operated at high efficiency at full power level as well as at alternative, lower power output levels.

It is still another object of the invention to provide a power amplifier that operates more efficiently in a linear or non-linear mode than the classic class B amplifier and which requires that only a single power supply voltage be supplied.

In accordance with one aspect of the invention, an efficient class BC amplifier for amplifying an input signal of varying amplitude, comprises a first power amplifier operating in class B mode for amplifying the input signal up to a first output level; a second power amplifier operating in class C mode for amplifying the input signal beyond the first output level; and coupling means for coupling outputs of the first and second power amplifiers to a common load impedance.

In accordance with another aspect of the invention, the inventive power amplifier comprises at least two amplifiers each optimized to supply power at a different power level, the amplifiers being permanently coupled together and to a load by a suitable coupling network having the property that the output impedance of an undriven or inactive one of the at least two amplifiers is transformed by the coupling network so as not to hinder delivery of power to the load by a driven one of the at least two amplifiers. High efficiency at alternative different output power levels is achieved by selecting for activation one of the amplifiers that is capable of providing full anticipated output power.

In accordance with still another aspect of the invention, the coupling network comprises a push-pull transformer having a center tap for receiving power from a power source that is common to all of the amplifiers. The load is coupled to the secondary winding of the transformer, and each of the amplifiers is coupled to corresponding taps on the primary winding of the transformer so that the turns ratio between any given amplifier and the load differs from that of another amplifier.

In accordance with still another aspect of the invention, the coupling means comprises at least two impedance matching networks, each coupled to receive power from a common power source and coupled to the load, and each further coupled to a corresponding one of the amplifiers, wherein each of the impedance matching networks performs a different impedance transformation between the load and a corresponding one of the amplifiers, whereby the power output level at which any one of the amplifiers achieves optimum efficiency differs from that of another amplifier.

In accordance with yet another aspect of the invention, each of the impedance matching networks comprises a quarter-wavelength line characterized by a matching ratio; and a balun having primary and secondary windings. The secondary winding is coupled to the quarter-wavelength line. The primary winding has a center tap coupled to receive power from a common power source. Remaining taps on the primary winding are each coupled to a corresponding one of the at least two amplifying means. The matching ratio of any one of impedance matching networks differs from that of another impedance matching network.

In still another aspect of the invention, a power amplifier circuit comprising at least two amplifiers, each coupled to a load and each having optimum efficiency at different power output levels, is operated in accordance with a method whereby an output signal may be supplied to the load at more than one alternative power level. The method comprises the steps of selecting one of the at least two amplifiers and activating the selected amplifier to produce an amplified signal for an entire cycle of an input signal being amplified by the activated amplifying means. Concurrent with the activating step, all non-selected amplifiers are deactivated. The amplified signal is then supplied from the activated amplifying means to the load, while the deactivated amplifiers are prevented from consuming signal power from the amplified signal.

In yet another aspect of the invention, a power amplifier circuit comprising at least two amplifiers, each coupled to a load and each having optimum efficiency at different power output levels, is operated in accordance with a method for supplying an output signal from the power amplifier circuit into the load at more than one alternative power level, the method comprising the steps of generating a control signal that is independent of the output signal, and using the control signal to select one of the at least two amplifiers. The selected amplifier is then activated to produce an amplified signal, and concurrent with the activating step, all non-selected amplifiers are deactivated. The amplified signal is supplied from the activated amplifier to the load, while the deactivated amplifiers are prevented from consuming signal power from the amplified signal.

In accordance with yet other aspects of the invention, the amplifiers of any of the above embodiments may be operated in a linear mode, or they may be operated in a saturated mode.

BRIEF DESCRIPTION OF THE DRAWINGS

The objects and advantages of the invention will be understood by reading the following detailed description in conjunction with the drawings in which.

DETAILED DESCRIPTION

Figure 1:
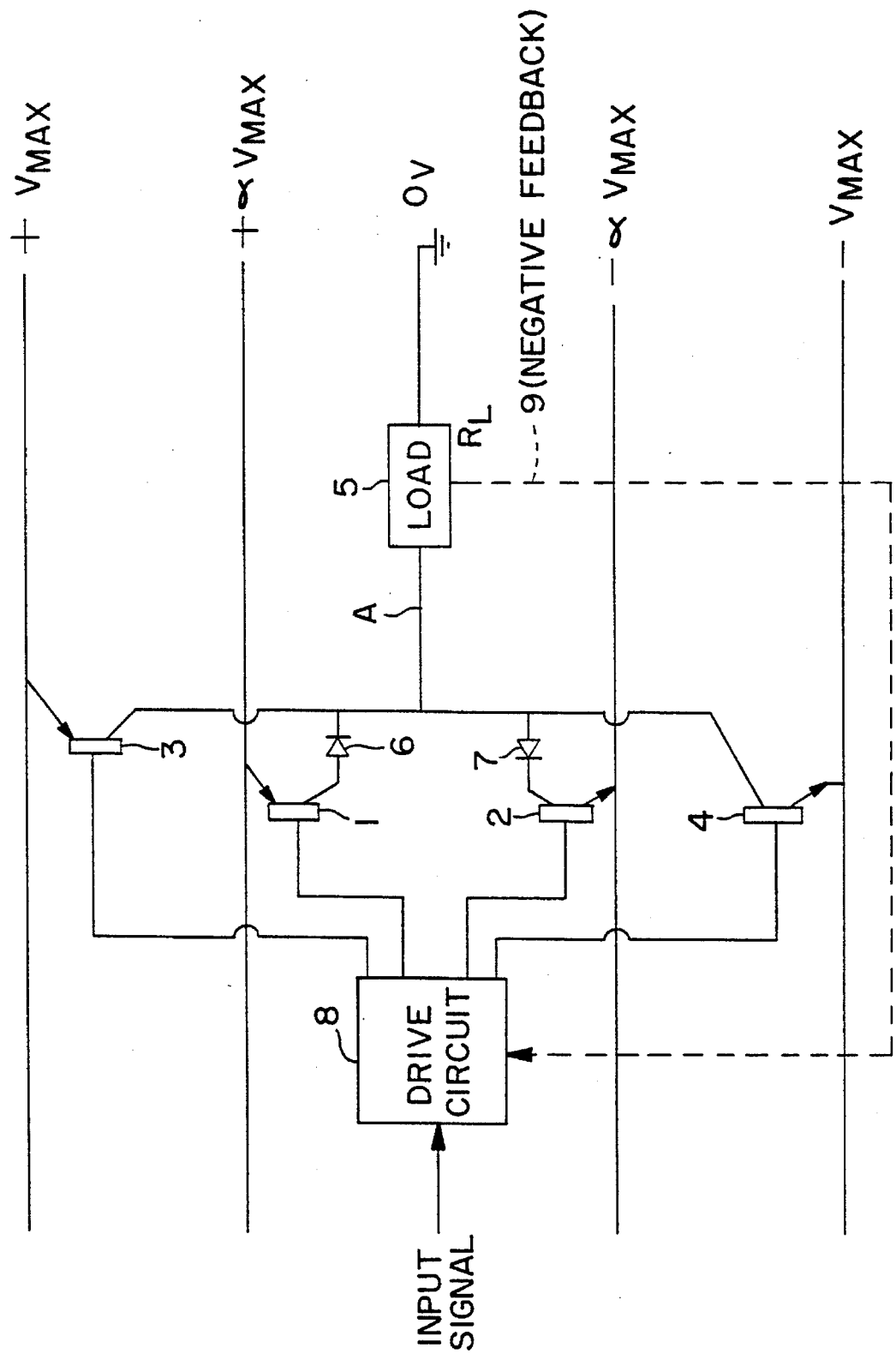
FIG. 1 is a schematic diagram of a linear class-BC amplifier, in accordance with one aspect of the present invention.

To overcome the aforementioned efficiency limitation of 78.5% for a linear class-B amplifier, the present invention includes an amplifier operating in a hybrid of class-B and class-C modes (henceforth referred to as a linear, class-BC amplifier), as described herein with reference to FIG. 1. Such an amplifier uses a first pair of push-pull transistors or other devices to generate the output signal waveform between 0 and $\pm\alpha$ times the maximum value, and then a second pair of push-pull devices takes over to generate the signal waveform values outside $\pm\alpha$ times the maximum and up to the maximum positive or negative voltage value.

As shown in FIG. 1, a first pair of complementary transistors 1, 2 is connected between symmetrical power supply voltage lines of $\pm\alpha\cdot$Vmax and are activated by drive circuit 8 to pull the load voltage at point A either up towards +Vmax (transistor 1 conducting) or down towards −Vmax (transistor 2 conducting). This part of the operation cycle thus uses the transistors 1, 2 in a linear mode of operation known as single-ended, push-pull, class-B. In this mode, the voltage may be made to vary between approximately $\pm\alpha\cdot$Vmax give or take any voltage drop in the transistors 1, 2 or diodes 6, 7 which may be neglected if $\alpha\cdot$Vmax is much larger than such losses. If the output voltage is varied in a sine-wave fashion in this mode, the rms output power will be:

$$\frac{(\alpha \cdot V_{max})^2}{2 \cdot R_L}$$

and the mean current consumption from each of the power supply lines is

| SUPPLY | MEAN CURRENT | MEAN POWER |
|---|---|---|
| +Vmax | 0 | 0 |
| +$\alpha \cdot$ Vmax | $\dfrac{\alpha \cdot V_{max}}{\pi \cdot R_L}$ | $\dfrac{(\alpha \cdot V_{max})^2}{\pi \cdot R_L}$ |
| −$\alpha \cdot$ Vmax | $\dfrac{\alpha \cdot V_{max}}{\pi \cdot R_L}$ | $\dfrac{(\alpha \cdot V_{max})^2}{\pi \cdot R_L}$ |
| −Vmax | 0 | 0 |
| Total Power Consumption | | $\dfrac{2 \cdot (\alpha \cdot V_{max})^2}{\pi \cdot R_L}$ |

By dividing the output power by the power consumption the efficiency is found to be $\pi/4$, which is the limiting theoretical value for class-B.

In the inventive linear class-BC amplifier of FIG. 1 however, the output voltage swing may be increased above the $\alpha\cdot$Vmax value above by activating a second pair of transistors 3, 4. The drive circuit 8 is controlled by a negative feedback signal 9 to activate the second pair of transistors 3, 4 when it detects that the demanded output voltage is greater than the first pair of transistors 1, 2 can supply. When the output voltage at point A is taken above +$\alpha\cdot$Vmax and up towards +Vmax by activating transistor 3, diode 6 becomes back-biased, stopping transistor 1 from taking power from the intermediate +$\alpha\cdot$Vmax supply line even if transistor 1 continues to be biased to conduct. Instead, transistor 3 supplies the load current from the higher, +Vmax supply line in this region.

Likewise, when transistor 4 is activated to take the load voltage at points below the maximum negative value of $-\alpha \cdot V_{max}$ which transistor 2 can supply and down towards $-V_{max}$, diode 7 becomes back biased, thereby preventing transistor 2 from drawing current from the intermediate supply line of $-\alpha \cdot V_{max}$, even if transistor 2 continues to be biased to conduct. Instead, transistor 4 supplies the load current from the more negative, $-V_{max}$ supply line in this region.

If the output voltage is caused to vary between $\pm V_{max}$ by this means, current is consumed from each of the four power supply lines part of the time but with the advantage over pure class-B that current is taken only from reduced voltage supply lines for that proportion of the time that the output voltage lies between $+/-\alpha \cdot V_{max}$, with a consequent increase in efficiency to a theoretical 85.6% when $\alpha=1/\text{root}(2)$. For a full-amplitude sine wave signal, the measured efficiency on a test prototype agreed with the theoretical value of 85.6%.

The linear class-BC amplifier described above has several drawbacks for very high frequency operation. First, the state of the art of semiconductor diodes does not allow very fast reversal of state for RF let alone microwave frequencies; consequently, the class-BC amplifier of FIG. 1 is normally restricted to audio frequency or medium frequency RF applications. Moreover, the circuit requires that intermediate power supply voltages be provided. In accordance with other aspects of the invention, these drawbacks are eliminated.

Figure 2:
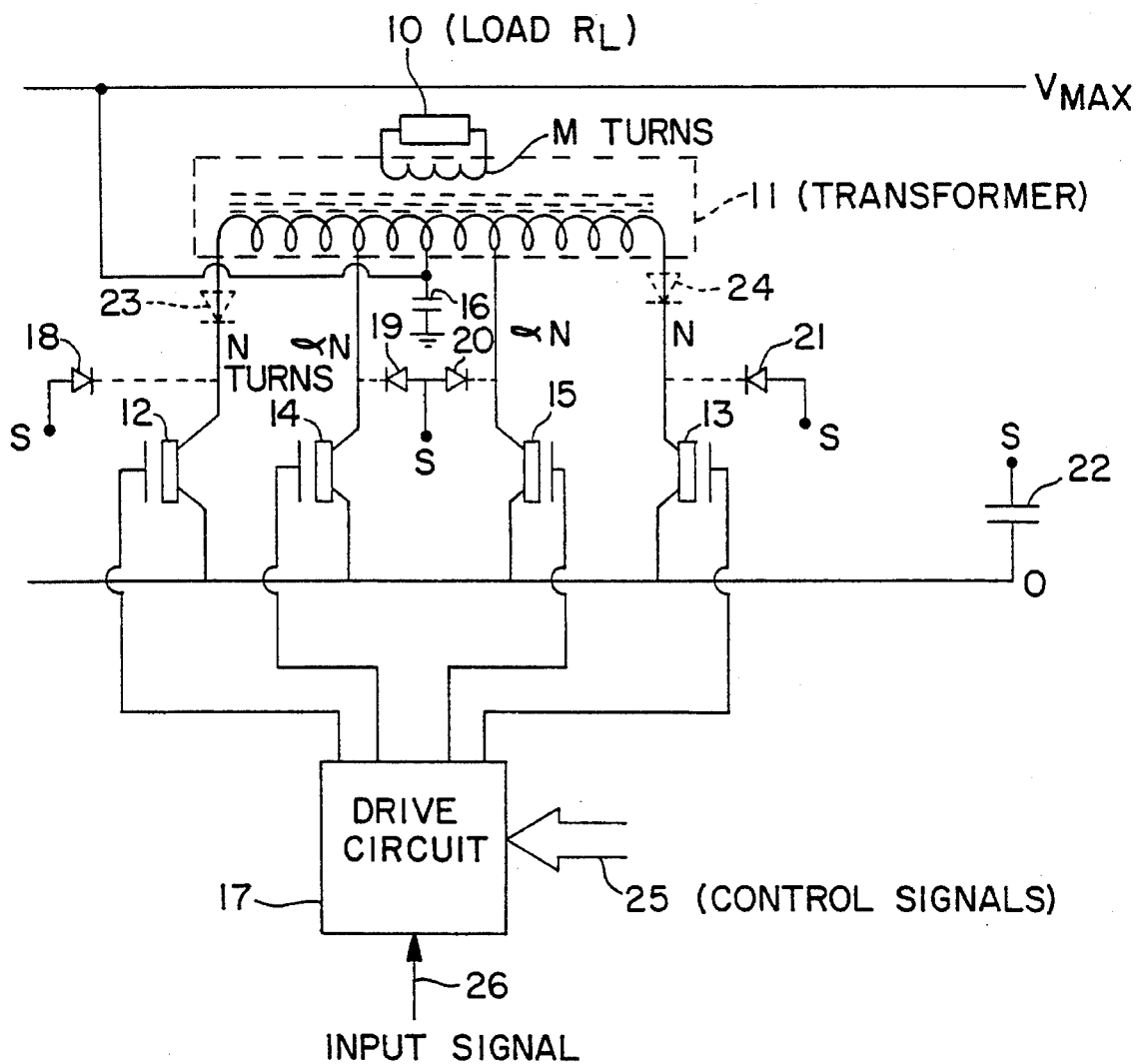
FIG. 2 is a schematic diagram of a class-BC high frequency amplifier in accordance with another aspect of the present invention.

Referring now to FIG. 2, a preferred embodiment of the present invention has a number of amplifiers (preferably pairs of FETs arranged in push-pull configurations), each coupled to deliver power to a load $R_L$ 10. A drive circuit 11 receives an input signal 26 that is to be amplified by the power amplifier. The drive circuit 17 additionally receives control signals 25 that designate which of the pairs of FETs (either FETs 12, 13 or FETs 14, 15) is to be activated at any given moment. As is described below in greater detail, generation of the control signals 25 may be independent of the instantaneous output signal that is supplied to the load 10. The drive circuit 17 utilizes the control signals 25 to route the input signal 26 to the selected amplifier to be activated. The drive circuit 17 also generates signals to ensure that non-selected amplifiers are turned off, preferably by applying a negative bias to the gate electrodes of the non-selected FETs. The drive circuit 17 further includes means for matching and tuning the FET gate input capacitance for high frequency operation. Those having ordinary skill in the art will readily be able to design a drive circuit that acts in accordance with these parameters.

Further in accordance with the invention, the problem of having to provide intermediate voltages (as shown in FIG. 1) is addressed by having a first pair of FETs 12, 13 being connected to a high-frequency push-pull output transformer 11. A common power source (not shown) supplies power ($V_{max}$) to a center tap of a primary winding of the transformer 11. The turns ratio of the transformer between the first pair of FETs 12, 13 and the load 10 is N--O--N to M. Thus when FET 12 is caused to conduct by a signal from the drive circuit 17, the load voltage can be varied between 0 and $(M/N) \cdot V_{max}$.

Likewise, when the drive circuit 17 alternatively causes FET 13 to conduct, the load voltage can be varied between 0 and $-(M/N) \cdot V_{max}$.

If the load voltage is varied between $\pm(M/N) \cdot V_{max}$ in a sine wave fashion, this means that the amplifier is operating in class-B mode with a theoretical efficiency of 78.5% at an output power level of $$\frac{((M/N) \cdot V_{max})^2}{2 \cdot R_L}$$

By alternatively activating FET 14 or FET 15 with appropriate signals from the drive circuit 17, the load voltage can be made to vary between the values of $\pm(M/N) \cdot V_{max}/\alpha$, because the FETs 14, 15 are coupled to the load 10 using a different transformer turns ratio $\alpha$N--O--$\alpha$N to M. When FET 14 conducts to create maximum positive voltage across the load, FET 12 will have a negative drain voltage equal to $-V_{max} \cdot (1-\alpha)/\alpha$.

To prevent the FET 12 from conducting under conditions of negative drain voltage and thereby reducing efficiency of the circuit and causing distortion of the output signal, the gate voltage must be held at less than the drain voltage by the drive circuit 17, and also, assuming construction in bulk CMOS technology, the semiconductor substrate voltage must be held at less than the maximum negative drain voltage. For example, for $V_{max}=+8$ VOLTS and $\alpha=1/\text{root}(2)$, the drains and substrates of FETs that are OFF must be held below approximately $-3$ Volts. This condition for the substrate may be achieved by allowing the substrate to float apart from a decoupling capacitor 22, which will become charged to the maximum negative drain voltage by the rectifying action of parasitic drain-substrate diodes 18, 19, 20, 21.

Alternatively, optional diodes 23, 24 (shown in dotted lines) can be used which have a function similar to that of the diodes 6, 7 shown in FIG. 1. Diode 23 prevents FET 12 from taking current when the FET 14 has been ordered by its corresponding drive signal to take over the load, even if the FET 12 remains biased to conduction. Similarly, the diode 24 prevents the FET 13 from taking current when the FET 15 has been ordered by its corresponding drive signal to take over the load, even if the FET 13 remains biased to conduction.

While this can simplify the biasing arrangements and the drive circuit, for very high frequencies such as microwave frequencies the optional diodes 23, 24 can become frequency limiting components due to the speed at which they can switch from forward conduction to reverse conduction. The use of the optional diodes 23, 24, then, can be the most appropriate solution for lower frequencies and high supply voltages, as for example when the inventive amplifier is used as an efficient sinewave DC to AC power supply convertor, while omitting the optional diodes 23, 24 can be the most appropriate solution for high-frequency applications with low supply voltages, such as for a transmitter power amplifier in a battery-operated mobile wireless telephone.

The inventive amplifier of FIG. 2 permits operation in any of the following seven modes:

i) Linear (i.e., class-A, B or AB) at a first power level with only FETs 12, 13 driven and FETs 14, 15 biased OFF.

ii) As above but saturated (i.e., FETs 12, 13 driven to clipping).

iii) Linear class A, B or AB at a second power level with only FETs 14, 15 activated and FETs 12, 13 held biased OFF.

iv) As (iii) but saturated (i.e., FETs 14, 15 driven to clipping).

v) Linear class-BC with FETs 12, 13 driven to conduct for only that part of the output waveform cycle having values between $\pm(M/N) \cdot V_{max}$ and with the FETs 14, 15 then being driven for the output waveform voltages outside the above ranges. (This mode corresponds to the mode of operation described above with respect to FIG. 1.)

vi) As (v) but saturated (i.e., FETs 14, 15 driven to clipping).

vii) For varying amplitude signals, operating as in mode (i) whenever it is known in advance that the desired output amplitude will not exceed a threshold, and operating as in mode (iii) or (v) whenever the desired output amplitude is expected to exceed the threshold.

In principle, all of the above modes can be selected by means of appropriate control signals 25 depending on the output power level required. In practice, however, not all modes will be required in a given operation. For example, in a mobile phone transmitter application, class-BC modes (v) and (vi) may be hard to realize at typical frequencies of 1 GHz. In a dual-mode mobile phone having both varying amplitude digital and constant amplitude analog modes such as the inventive dual-mode phone described in U.S. patent application Ser. No. 07/967,027 which is hereby incorporated by reference, the modes of primary interest are (i), (ii), (iii) and (vii).

Mode (i) is selected when it is desired to use varying amplitude modulation at not more than the first power level (a reduced power level compared to full power in digital mode). Mode (ii) can be used when constant amplitude modulation (e.g., Advanced Mobile Phone Service (AMPS) FM mode) is required at a continuous but reduced FM power level, and mode (iii) is used when higher peak power is required intermittently in digital mode. Selecting the modes in this way constitutes mode (vii) as set forth above.

The value of $\alpha$ may be chosen to obtain the correct desired relationship between the peak power of the full power digital (varying amplitude) mode and the full power level of the FM mode. For example, in a handheld portable phone according to the above-cited U.S. patent application Ser. No. 07/967,027, the full power level of the FM AMPS mode is 600 mW out of the antenna. The full power level in the digital mode is also 600 mW mean, but due to the varying amplitude is 1.2 W peak. Thus choosing $\alpha$ to be approximately $1/\text{root}(2)$ allows mode (iii) to achieve double the peak power level compared to the power level in mode (i) or (ii). The half-power linear mode (i) may then be used when the portable phone is commanded by the base station to reduce its output from full output to a next step down or lower. In this way, the efficiency in the FM mode or reduced power digital modes is considerably improved.

At high frequencies above 1 GHz for example, it can be difficult to implement transformers such as the transformer 11 because they tend at those frequencies to degenerate into single-turn devices. Thus, in accordance with another aspect of the invention, impedance transformations between an amplifier and a load are not usually implemented by transformer turns ratios such as M/N, but rather by matching networks that may be inductor-capacitor filter structures or transmission line networks such as quarter-wave transformers, stub or stripline networks. A preferred embodiment of an idealized form of such a circuit adapted to realize the inventive class-BC amplifier is shown in FIGS. 3(a) and 3(b).

Figure 3A:
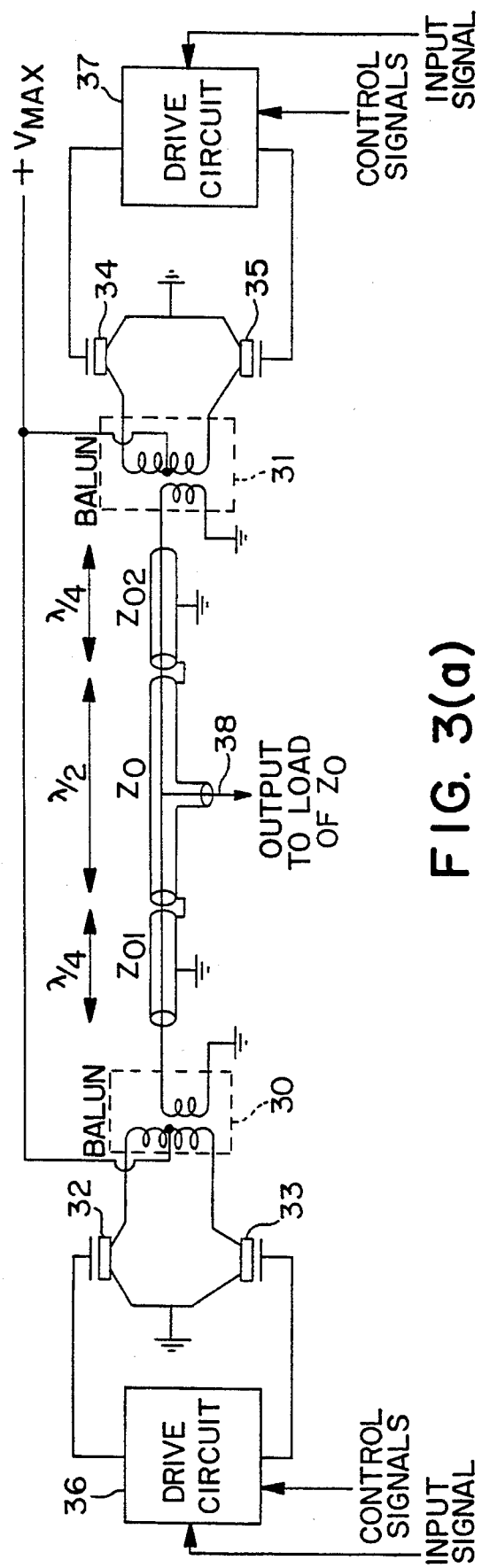
FIGS. 3(a), 3(b) and 3(c) are schematic diagrams of amplifiers using transmission line transformers in accordance with still other aspects of the present invention.
Figure 3B:
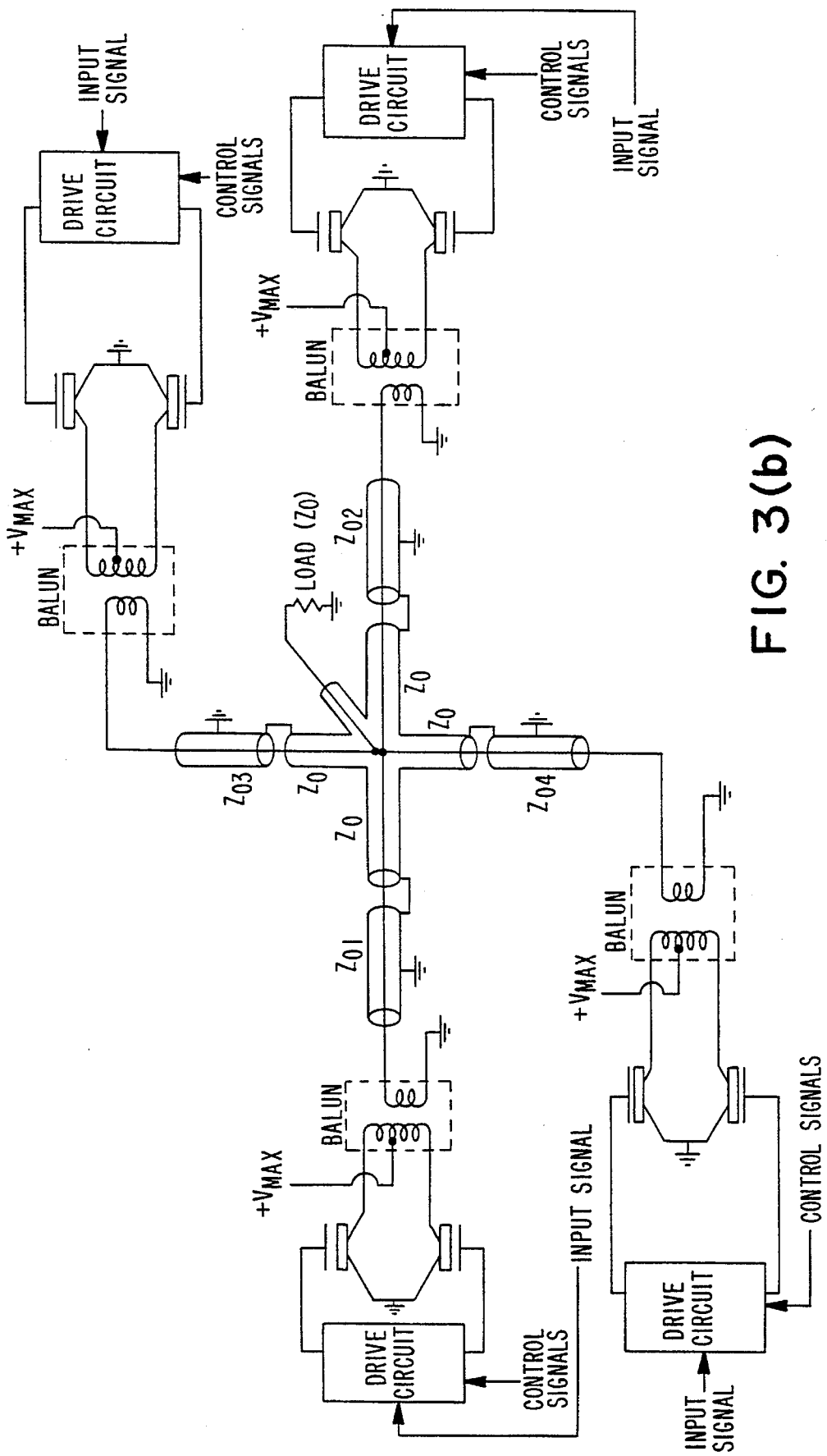

FIG. 3(a) shows a first push-pull transistor amplifier pair 32, 33 connected by a suitable balanced-to-unbalanced convertor (balun) 30 to a quarter wave transformer of characteristic impedance Zo1 and then through a quarter wave of matched transmission line Zo having a T-junction 38 to a load (not shown) of impedance Zo. A second push-pull transistor amplifier pair 34, 35 is connected through a balun 31 and quarter wave transformer Zo2. In this way, the transistors 32, 33 see a load impedance of $Zo1^2/Zo$ via balun 30 while transistors 34, 35 see a load of $Zo2^2/Zo$ via balun 31. Thus the idealized theoretical linear (class-B) output power from the transistor amplifier pair 32, 33 is $$0.5 \cdot V_{max}^2 \cdot Zo/Zo1^2$$

while transistors 34, 35 can produce equivalently $$0.5 \cdot V_{max}^2 \cdot Zo/Zo2^2$$

assuming that the baluns 30, 31 have (1+1):1 transformation ratios.

If only transistor pair 32, 33 is activated via drive circuit 36, and drive circuit 37 holds the transistors 34, 35 biased off, then the open-circuit drains of transistors 34, 35 will transform via quarter-wave transformer Zo2 to a short circuit at the junction with the Zo line, and then transform further through the quarter wave line back to an open circuit at the load T-junction 38. Thus transistors 34, 35 when biased OFF do not affect the transfer of power from transistors 32, 33 to the load. Furthermore, assuming Zo2<Zo1, the voltage swing produced at the transistors 34, 35 when the transistors 32, 33 are generating their maximum output will not exceed Vmax so the drains of transistors 34, 35 never become negative.

If now transistors 34, 35 are activated by their respective drive circuit 37 to provide power in load at the T-junction 38 and Zo2<Zo1, a higher power can be produced. This power will be higher by the factor $(Zo1/Zo2)^2$, and when generating maximum output the drains of transistors 32, 33 can then swing negative necessitating that the gates and substrates of transistors 32, 33 be held at a more negative voltage than the maximum negative drain swing in order to prevent unwanted conduction that can reduce efficiency and cause signal distortion. It can be understood therefore that this design permits the transistors 32, 33 alone to efficiently generate power in the load up to a first value determined by Zo1, the maximum efficiency in linear class-B mode being theoretically 78.5%, while the transistors 34, 35 alone can generate power beyond this level up to a second, higher level determined by Zo2 and at the maximum, linear, class-B output will at that level also achieve theoretically the 78.5% class-B efficiency. Thus with the inventive arrangement it is possible to achieve maximum class-B efficiency at two different, alternative power levels. In accordance with another aspect of the invention, this principle is extended by tee-ing in further push-pull transistor amplifier pairs via further quarter-wave lines (Zo3, Zo), (Zo4,Zo) to the common junction point of the load, as illustrated in FIG. 3(b).

Figure 3C:
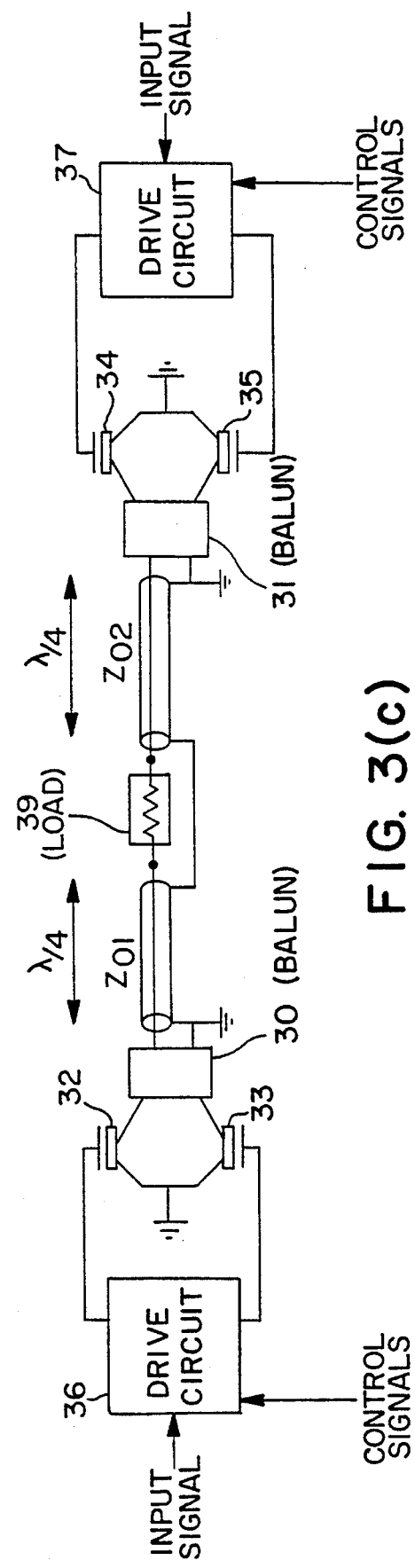

In accordance with still another aspect of the present invention, FIG. 3(c) shows a functionally equivalent alternative embodiment which avoids the T-junction line Zo. In this arrangement, when the transistors 34, 35 are not driven and in open-drain mode, their open-circuit output impedance is transformed through Zo2 into a short circuit on the right hand end of the load 39 while the left hand end of the load 39 is supplied with power from transistors 32, 33. In the alternative, higher power mode the transistors 32, 33 are open drain which is transformed through Zo1 into a short circuit on the left-hand end of the load 39 while the transistors 34, 35 supply power to the right hand end.

It will be appreciated by those skilled in the art of microwave amplification design that the operation has been idealized for the purpose of description. In practice, FETs that are turned OFF are not open circuit but instead present a parasitic capacitance output impedance. Nevertheless, these parasitic output capacitances can be absorbed into the design of the matching or coupling network between the transistors and the load. The requirement that such a network design must fulfil for correct operation of the inventive amplifier is, for an amplifier of the type depicted in FIGS. 3(a) or 3(b), that the chain matrices of the networks between the transistor drains and the load should have zero off-diagonal elements, while the requirement for the circuit depicted in FIG. 3(c) is that the chain matrix should have zero main diagonal elements. A person having ordinary skill in the art will be able to design suitable networks fulfilling these requirements using either transmission line networks or discrete reactive components or a mixture. A person skilled in the art will also recognize that the amplifier formed by the drive circuit 36, push-pull transistor amplifier pair 32, 33, and balun 30 as well as the amplifier formed by the drive circuit 37, push-pull transistor amplifier pair 34, 35, and balun 31 can each equally be replaced with amplifiers of the complementary single-ended, push-pull variety such as may be constructed using complementary MOS transistor technology. Alternatively, complementary bipolar or GaAs heterojunction bipolar transistor (HBT) transistors may be used to form a single-ended push-pull power amplifier, but in this case, series diodes (not shown) as illustrated in FIG. 1 (diodes 6,7) are required to protect the lower power pair from having their collector-base junctions become forward biased when the higher power pair operates.

With each of the amplifiers operated in a linear mode, all of the above-described implementations of the inventive power amplifier circuit can handle signals of variable amplitude in one of three ways:

1) By activating only one amplifier or the other according to a-priori knowledge of the peak output power needed. This mode might comprise, for example, using one amplifier for the duration of an entire output signal cycle (which is equivalent to the duration of an entire input cycle) when a digital mode is selected and alternatively using the other amplifier when an analog mode is selected; or using one amplifier for the duration of an entire output signal cycle when a reduced power level is selected and alternatively using the other amplifier when a higher power level is selected; or 2) By activating transistors of each amplifier pair dynamically at different levels of a single signal waveform cycle such that a first pair produces load current at output voltages up to a first level and then a second pair takes over production of load current for output voltages up to a second level; or 3) By dynamically selecting either a first pair of transistors or a second pair of transistors to sustain load current not dynamically according to the instantaneous (e.g., RF) output voltage required but dynamically on a relatively slower timescale in correspondence with the amplitude modulation or envelope anticipated to be required on the output signal.

In the third case above, it is common in current practice to generate representations of modulated signals digitally using a digital signal processor (DSP) and then to convert the digitized signals to analog form before being upconverted into the desired output frequency signal for driving the transmit power amplifier. It is thus a simple matter for such a DSP to recognize that the power amplifier is about to be required to produce an amplitude that is beyond the capabilities of a first amplifier, and in response to generate a drive signal for a second, higher power amplifier instead. The selection to drive one or the other amplifier is in this case made on the relatively slow timescale of the modulation and not within the timescale of the radio carrier frequency cycle. Nevertheless, taking as an example a two-tone test signal, which exhibits 100% amplitude modulation in a sine-wave fashion, a substantial efficiency advantage for the inventive amplifier may be calculated as follows:

First the efficiency of conventional, prior-art class-B is calculated for a two-tone test signal.

For an output signal of the form $V_{max} \cdot \cos(\omega_m \cdot t) \cdot \cos(\omega_c \cdot t)$ where $\omega_m$ is half the two-tone spacing and $\omega_c$ is the carrier frequency, the DC current average of the RF cycle (of $\omega_c$) is given by:

$$I_{dc} = \frac{2 \cdot V_{max} |\cos(\omega_m \cdot t)|}{\pi \cdot R_L}$$

Averaging this once more over the modulation cycle $\omega_m$ gives a mean DC current of:

$$I_{dc} = 4 \cdot V_{max}/(\pi^2 \cdot R_L)$$

The DC power consumption is equal to the current consumption times the supply voltage Vmax, i.e.,:

$$P_{dc} = 4 \cdot V_{max}^2/(\pi^2 \cdot R_L)$$

The output power averaged over the RF cycle ($\omega_c$) is given by:

$$\frac{(V_{max} \cdot \cos(\omega_m \cdot t))^2}{2 \cdot R_L}$$

Averaging this once more over the modulation cycle ($\omega_m$) gives a mean output power:

$$P_{out} = V_{max}^2/(4 \cdot R_L)$$

The efficiency is thus $P_{out}/P_{dc} = \pi^2/16$ or approximately 61%.

Using the inventive amplifier operated in the third of the modes described above, the expression for power output is the same while the expression for DC power consumption is a function of the parameter $\alpha$ as follows:

$$P_{dc} = (2/\pi)^2 \cdot \frac{V_{max}}{R_L} \left( \alpha^2 + (1-\alpha^2)(1-\alpha)/\left(1 - \frac{2}{\pi} \cdot \sin^{-1}(\alpha)\right) \right)$$

Efficiency is maximized at 78.05% when $\alpha$ is set to the value 0.659. Thus the inventive amplifier raises the theoretical efficiency limit on a two-tone test from 61% for class-B to 78% for the inventive amplifier.

It will be appreciated that the value of $\alpha$ which maximizes the efficiency will depend on the amplitude statistics of the expected signal, and thus a value other than 0.659 may be optimum for signals other than the sum of two sine waves. Other common signal statistics include the Gaussian amplitude probability distribution and a different optimum value for $\alpha$ would be calculated for that case. This exercise is not carried out here as a characteristic of the Gaussian distribution is that its peak value is unlimited, so clipping is inevitable for a certain fraction of the time. The Gaussian signal scaling is another parameter that must also be chosen such that the amount of clipping does not produce excessive intermodulation distortion or excessive unwanted spectral components. The value of $\alpha$ will depend on this second parameter and it is beyond the scope of this disclosure to investigate all combinations, which can be performed by one having ordinary skill in the art using the above calculations as a guide.

All such variations described in the specification above, including variations in the networks or means to avoid reverse biased inactive amplifiers causing distortion or reducing efficiency as may be devised by someone of skill in the art according to the outlined principles above, are considered to fall within the scope of the invention.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A power amplifier circuit for efficiently generating an output signal into a load at more than one alternative power level, comprising:
   at least two amplifying means, each having optimum efficiency at different power output levels;
   drive signal means, coupled to the at least two amplifying means, for selectively activating any one of the at least two amplifying means and for deactivating all amplifying means that have not been selected for activation, wherein
      the activated amplifying means generates the output signal to be supplied to the load; and
      selection is based on amplitude of a modulating signal having a frequency that is slower than that of a carrier signal being supplied as an input to the power amplifier circuit; and
   coupling means, coupled to each of the at least two amplifiers and to the load, for coupling the at least two amplifying means to the load in a manner such that signal power flowing from the activated amplifying means to the load is not impeded by the deactivated amplifying means.

2. The power amplifier circuit of claim 1, further comprising means, coupled to the at least two amplifying means, for preventing the deactivated amplifying means from reducing efficiency of the power amplifier when the activated amplifier causes a greater output signal voltage excursion than the deactivated amplifying means are capable of generating when activated.

3. The power amplifier circuit of claim 2, wherein the preventing means applies a reverse bias to an input electrode of the deactivated amplifying means, the reverse bias being applied independently of an instantaneous output signal level of the power amplifier circuit.

4. The power amplifier of claim 2, wherein the preventing means comprises a diode connected between the coupling means and an output terminal of one of the at least two amplifying means.

5. The power amplifier circuit of claim 1, further comprising means, coupled to the at least two amplifying means, for preventing the deactivated amplifying means from distorting the output signal when the activated amplifier causes a greater output signal voltage excursion than the deactivated amplifying means are capable of generating when activated.

6. The power amplifier circuit of claim 5, wherein the preventing means applies a reverse bias to an input electrode of the deactivated amplifying means, the reverse bias being applied independently of an instantaneous output signal level of the power amplifier circuit.

7. The power amplifier of claim 5, wherein the preventing means comprises a diode connected between the coupling means and an output terminal of one of the at least two amplifying means.

8. A power amplifier circuit for efficiently generating an output signal into a load at more than one alternative power level, comprising:
   at least two amplifying means;
   drive signal means, coupled to the at least two amplifying means, for selectively activating any one of the at least two amplifying means and for deactivating all amplifying means that have not been selected for activation, wherein the activated amplifying means generates the output signal to be supplied to the load;
   input means for receiving power from a common power source; and
   coupling means, coupled to the input means, to each of the at least two amplifying means and to the load, for supplying power from the common power source to each of the at least two amplifying means, and for coupling the at least two amplifying means to the load in a manner such that each of the at least two amplifying means has optimum efficiency at a correspondingly different power output level and such that signal power flowing from the activated amplifying means to the load is not impeded by the deactivated amplifying means,
   wherein the coupling means comprises at least two impedance matching networks, each coupled to the input means and to the load, and each further coupled to a corresponding one of the at least two amplifying means, wherein an impedance transformation of a first one of the impedance matching networks that is coupled to a first one of the amplifying means is different from an impedance transformation of a second one of the impedance matching networks that is coupled to a second one of the amplifying means, whereby optimum efficiency of the first amplifying means occurs at a first power output level and optimum efficiency of the second amplifying means occurs at a second power output level, the first and second power output levels not being equal to one another,
   and wherein further:
   each of the at least two impedance matching networks comprises:
      a quarter-wavelength line characterized by a matching ratio; and
      a balun having a secondary winding coupled to the quarter-wavelength line and a primary winding having a center tap coupled to the input means and remaining taps for coupling to a corresponding one of the at least two amplifying means; and
   a first one of the at least two impedance matching networks has a first matching ratio and a second one of the at least two impedance matching networks has a second matching ratio, the first matching ratio not being equal to the second matching ratio.

9. A method for operating a power amplifier circuit to generate an output signal into a load at more than one alternative power level, the power amplifier circuit comprising at least two amplifying means, each coupled to the load and each having optimum efficiency at different power output levels, the method comprising the steps of:
   generating a control signal that is independent of the output signal;
   using the control signal to select any one of the at least two amplifying means;

activating the selected amplifying means to produce an amplified signal;

concurrent with the activating step, deactivating all amplifying means that have not been selected for activation;

supplying the amplified signal from the activated amplifying means to the load; and preventing the deactivated amplifying means from consuming signal power from the amplified signal, wherein the step of generating a control signal comprises generating a control signal based on a modulating signal having a frequency that is slower than that of a carrier signal being supplied to the power amplifier circuit.

* * * * *